US012613110B2

(12) United States Patent
Debski et al.

(10) Patent No.: US 12,613,110 B2
(45) Date of Patent: Apr. 28, 2026

(54) SYSTEMS AND METHODS FOR MOTOR POSITION SENSING

(71) Applicant: Aptiv Technologies AG, Schaffhausen (CH)

(72) Inventors: Janusz Debski, Wieliczka (PL); Wojciech Typrowicz, Bęczyn (PL); Krysztof Tokarz, Łapczyca (PL)

(73) Assignee: Aptiv Technologies AG, Schaffhausen (CH)

( * ) Notice: Subject to any disclaimer, the term of this patent is extended or adjusted under 35 U.S.C. 154(b) by 133 days.

(21) Appl. No.: 18/443,606

(22) Filed: Feb. 16, 2024

(65) Prior Publication Data

US 2024/0280379 A1     Aug. 22, 2024

(30) Foreign Application Priority Data

Feb. 20, 2023    (GB) ..................................... 2302400

(51) Int. Cl.
| | |
|---|---|
| *G01D 5/14* | (2006.01) |
| *G01R 33/00* | (2006.01) |
| *G01R 33/07* | (2006.01) |
| *H02K 11/215* | (2016.01) |
| *H02P 6/16* | (2016.01) |

(52) U.S. Cl.
CPC ......... *G01D 5/145* (2013.01); *G01R 33/0094* (2013.01); *G01R 33/07* (2013.01); *H02K 11/215* (2016.01); *H02P 6/16* (2013.01)

(58) Field of Classification Search
CPC .. G01D 5/145; H02K 11/215; G01R 33/0094; G01R 33/07; H02P 6/16
See application file for complete search history.

(56) References Cited

U.S. PATENT DOCUMENTS

| | | | |
|---|---|---|---|
| 5,442,283 A | 8/1995 | Ravi | |
| 6,657,476 B1 | 12/2003 | Bicking | |
| 10,982,978 B2 | 4/2021 | Gaydov | |
| 2014/0232387 A1* | 8/2014 | Muraoka | G01D 5/145 |
| | | | 324/251 |
| 2018/0224516 A1* | 8/2018 | Geisler | G01D 21/00 |
| 2020/0300934 A1 | 9/2020 | Gray | |

FOREIGN PATENT DOCUMENTS

| | | |
|---|---|---|
| CN | 115473459 A | 12/2022 |
| JP | 2002207053 A | 7/2002 |
| JP | 2003199379 A | 7/2003 |
| WO | 2005100922 A2 | 10/2005 |

OTHER PUBLICATIONS

Combined Search and Examination Report for GB2302400.3, 5 pages Aug. 25, 2023.
Extended European Search Report for EP24154511.0 dated Jul. 19, 2024, 10 pages.
Edward Ramsden, "Speed and Timing Sensors," in Hall-Effect Sensors: Theory and Applications, Chapter 8, pp. 151-175, ISBN: 978-0-75-067934-3 Jan. 1, 2006.

* cited by examiner

*Primary Examiner* — Reena Aurora
(74) *Attorney, Agent, or Firm* — Miller Johnson

(57)     ABSTRACT

A system includes a controller, a magnetic field sensor, and a signal conditioning circuit. The magnetic field sensor is configured to sense a position of a motor and provide an output signal. The signal conditioning circuit is configured to produce an AC-coupled output signal from the output signal. The AC-coupled output signal is an input to the controller. The controller is configured to process the AC-coupled output signal.

11 Claims, 3 Drawing Sheets

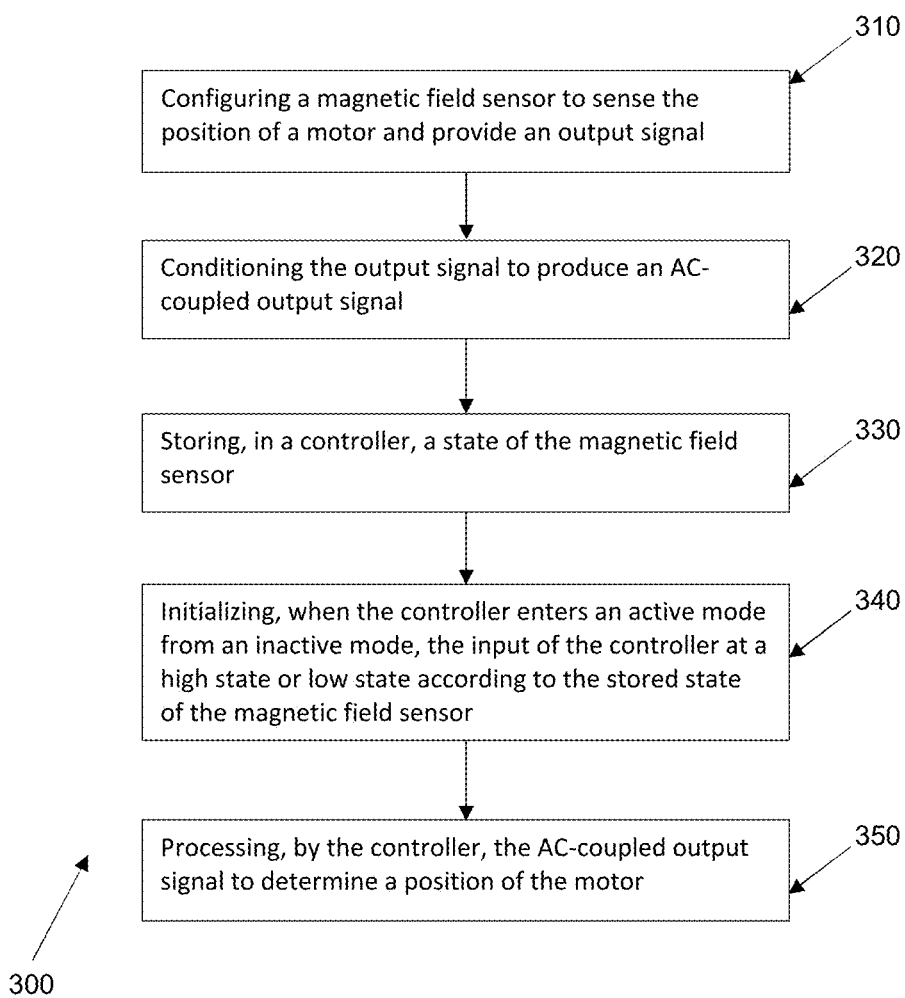

310

Configuring a magnetic field sensor to sense the position of a motor and provide an output signal

320

Conditioning the output signal to produce an AC-coupled output signal

330

Storing, in a controller, a state of the magnetic field sensor

340

Initializing, when the controller enters an active mode from an inactive mode, the input of the controller at a high state or low state according to the stored state of the magnetic field sensor

350

Processing, by the controller, the AC-coupled output signal to determine a position of the motor

SYSTEMS AND METHODS FOR MOTOR POSITION SENSING

CROSS-REFERENCE TO RELATED APPLICATIONS

This application claims priority to GB 2302400.3 filed Feb. 20, 2023, the entire disclosure of which is incorporated by reference.

FIELD

The present disclosure relates to the field of systems and methods for motor position sensing. Such systems and methods can be used for example in a vehicle to control motor-powered operations such as wing mirror opening & closing, seat adjustments, and so on.

BACKGROUND

Magnetic field sensors are used in motor position sensing applications. Hall-effect sensors, also called 'hall sensors', are commonly used although other types of magnetic field sensors are available and can also be used.

One application where motor position sensing is used is modern vehicles, where motor position sensing allows control of motors performing operations such as moving wing mirrors, adjusting seat positions and lumbar support, and so on. It is desirable for motor position sensing to work over a range of charge states of the vehicle battery, ambient temperature, and so on. In some applications more than 10 motor position sensors may be used in a vehicle seat, so cost becomes an important consideration.

Therefore, there is a need for improved methods and systems for motor position sensing.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The present disclosure concerns a system comprising: a controller; a magnetic field sensor configured to sense the position of a motor and provide an output signal; a signal conditioning circuit configured to produce an AC-coupled output signal from the output signal, the AC-coupled output signal being input to the controller; and wherein the controller is configured to process the AC-coupled output signal.

Advantageously, the system removes the need for a comparator, reducing printed circuit board (PCB) footprint and reducing cost. In addition, the AC-coupled output signal produced by the signal conditioning circuit is less sensitive to variations in battery voltage level and magnetic field sensor type, providing a more robust system.

The signal conditioning circuit may comprise a high-pass filter. Advantageously, the signal conditioning circuit may comprise a bandpass filter. This arrangement further increases the robustness of the system since the bandpass filter is configured to filter out at least some noise or ripple, reducing the likelihood of the noise or ripple causing detection errors by the controller.

Advantageously, the controller may be configured to operate in an active mode or an inactive mode, wherein the controller is configured: when in the active mode, to store a current state of each magnetic field sensor sensed at a respective controller input; when entering the active mode from the inactive mode, to initialize each respective controller input to the stored state of the respective magnetic field sensor. Initializing the controller input to the stored state of the magnetic field sensor when entering the active mode from the inactive mode prevents missed counts of pulses, thereby improving accuracy of the determined motor position.

The present disclosure also concerns a vehicle integrating the above system.

The present disclosure further concerns a method comprising: configuring a magnetic field sensor to sense the position of a motor and provide an output signal; conditioning the output signal to produce an AC-coupled output signal; and processing the AC-coupled output signal to determine a position of the motor.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The other features, purposes, and advantages of the disclosure will become more explicit by reading the detailed statement of the non-restrictive embodiments made with reference to the accompanying drawings.

FIG. 4 shows a method according to embodiments of the present disclosure.

In the drawings, reference numbers may be reused to identify similar and/or identical elements.

DETAILED DESCRIPTION

Figure 1:
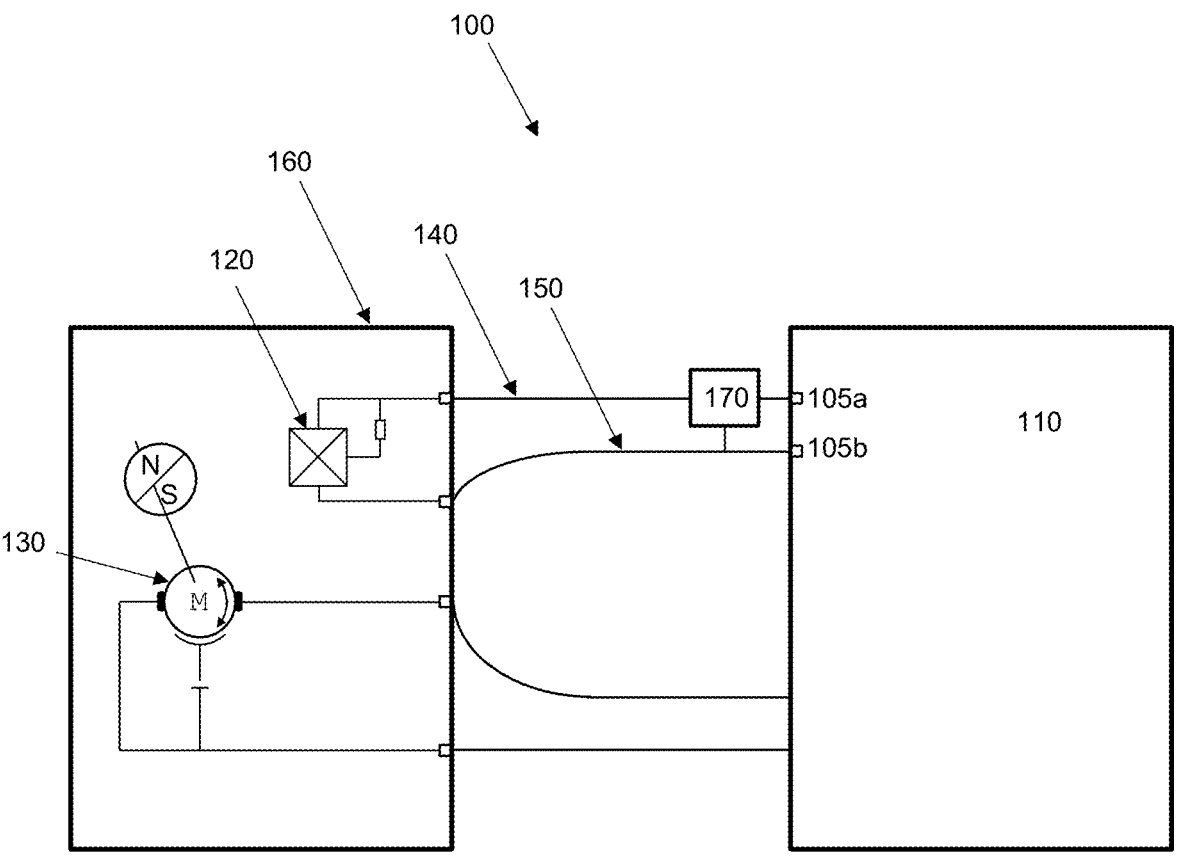
FIG. 1 shows a system for motor position sensing according to embodiments of the present disclosure.

FIG. 1 shows an example system 100 according to embodiments of the present disclosure. The system 100 comprises a controller 110 and a magnetic field sensor 120 configured to sense the position of a motor 130. The motor 130 is shown schematically in FIG. 1 without drive circuitry for simplicity. Any suitable motor type may be used according to requirements, for instance the motor 130 may be a brushed DC motor or a brushless DC motor in some implementations.

The magnetic field sensor 120 is electrically connected to the controller 110 in a configuration in which a supply voltage to the magnetic field sensor 120 and an output signal from the magnetic field sensor 120 are provided on a common wire 140. In the example system 100 shown in FIG. 1, the magnetic field sensor 120 is electrically connected to inputs 105a, 105b of the controller 110 using a two-wire configuration comprising the common wire 140 and another wire 150 which is connected to ground. The two-wire configuration reduces the amount of cabling required, saving space in wiring harnesses and reducing cost.

The magnetic field sensor 120 is configured to sense the position of the motor 130 and provide an output signal corresponding to the motor position. In some embodiments, the magnetic field sensor 120 and the motor 130 are provided in a common housing to form actuator 160. In other embodiments, the magnetic field sensor 120 may be separate to the motor 130. In some embodiments, the magnetic field sensor 120 is a Hall effect sensor.

The system 100 further comprises a signal conditioning circuit 170 configured to produce an AC-coupled output signal from the output signal. In the embodiment shown in FIG. 1, the signal conditioning circuit 170 is provided between the magnetic field sensor 120 and the controller 110 at the input 105*a* of the controller 110. The signal conditioning circuit 170 comprises an AC-coupling circuit 210 connected to the common wire 140 and configured to output the AC-coupled output signal, the AC-coupled output signal being input to the controller 100 at input 105*a*. The AC-coupling circuit 210 removes the DC supply voltage for the magnetic field sensor 120 which is present on the common wire 140 from the signal input to the controller 110, providing several benefits. First, the AC-coupling circuit 210 removes the need for a comparator, reducing PCB footprint and reducing cost. In addition, the AC-coupled output signal produced by the signal conditioning circuit 170 is less sensitive to variations in battery voltage level and magnetic field sensor type, providing a more robust solution.

The controller 110 is configured to process the AC-coupled output signal received at input 105*a*, as described in more detail below. In some embodiments, the controller 110 is configured to process the AC-coupled output signal by counting pulses on the AC-coupled output signal to determine the position of the motor 130. The controller 110 may be a microcontroller, an ASIC, a processor or any other suitable processing system. In the embodiment shown in FIG. 1, the controller 110 provides drive signals for the motor 130 via outputs 105*c* and 105*d*, though in other embodiments the drive signals for the motor 130 may be provided by other circuitry.

Figure 2:
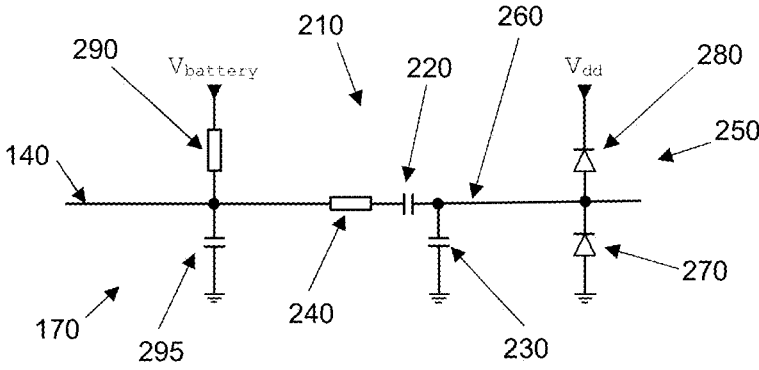
FIG. 2 shows a signal conditioning circuit of the system of FIG. 1.

Referring now to FIG. 2, the signal conditioning circuit 170 according to embodiments of the present disclosure is shown. The signal conditioning circuit 170 comprises the AC-coupling circuit 210 which is connected to the common wire 140 and which produces an AC-coupled output signal shown in FIG. 2 at 260. The AC-coupling circuit 210 comprises a first capacitor 220 configured inline with the common wire 140 to form a high pass filter such that DC signals on the common wire 140 do not pass through the first capacitor 220.

In some embodiments, the AC-coupling circuit 210 further comprises a second capacitor 230 and a resistor 240 which are configured, together with the first capacitor 220, to form a bandpass filter. This arrangement further increases the robustness of the system since the bandpass filter is configured to filter out at least some of any alternator ripple present on the common wire, reducing the likelihood of noise on the common wire causing detection errors by the controller 110.

In some embodiments, the signal conditioning circuit 170 is configured to limit voltages in the AC-coupled output signal 260 to an upper limit and a lower limit. In some embodiments, the signal conditioning circuit 170 further comprises a voltage clamping circuit 250 comprising a first diode 270 configured to clamp negative voltages in the AC-coupled output signal 260 to at the lower limit, and a second diode 280 configured to clamp positive voltages in the AC-coupled output signal 260 at the upper limit. In some embodiments, the lower limit is ground and the upper limit is the controller 110's supply voltage, $V_{dd}$. The voltage clamping circuit 250 protects the input 105*a* of the controller 110 from possible damage from under- or over-voltages in the AC-coupled output signal 260. The resistor 240 limits pulse injection currents to protect the diodes 270, 280 from excess currents.

In some embodiments, the voltage clamping circuit 250 may be integral to the controller 110, for instance as part of the input 105*a* circuitry.

Also shown in FIG. 2 is a pull-up resistor 290 connected between the common wire 140 and a voltage source $V_{battery}$. Where the system 100 is provided in a vehicle, $V_{battery}$ may be the vehicle's battery voltage. A capacitor 295 is connected between the common wire 140 and ground. The pull-up resistor 290 and the capacitor 295 provide the supply voltage to the magnetic field sensor 120.

Figure 3:
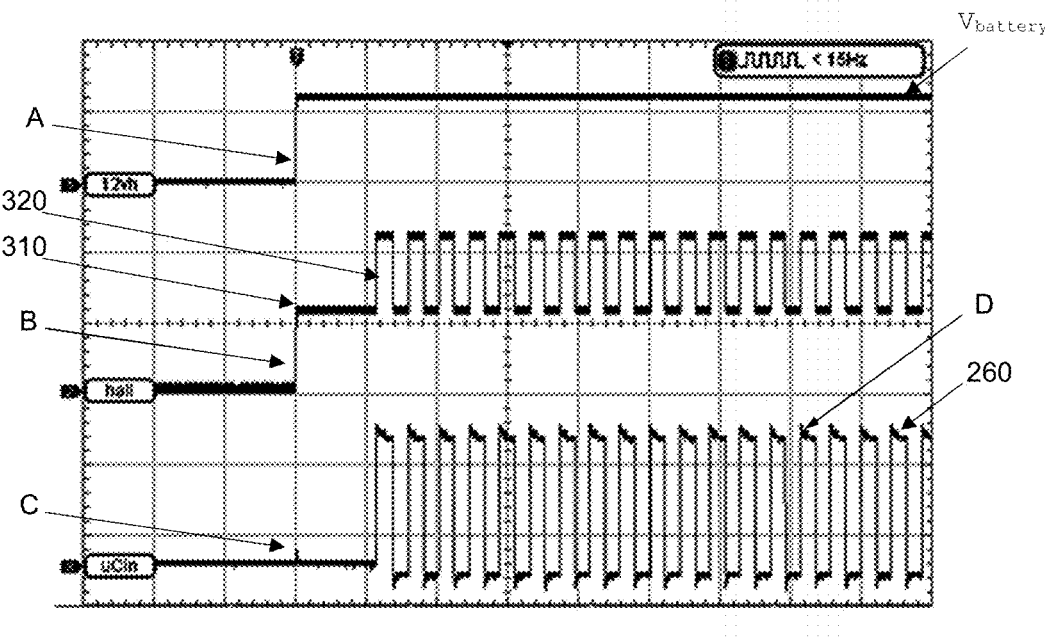
FIG. 3 shows signal measurements of the signal conditioning circuit of FIG. 2.

Referring now to FIG. 3, there is shown example signal measurement traces. The uppermost trace A shows voltage source $V_{battery}$, the middle trace B shows the signal present on the common wire 140, and the lowermost trace C shows the AC-coupled output signal 260.

In the example of FIG. 3, voltage source $V_{battery}$ is a 12V vehicle battery, however it will be appreciated that the system 100 may be used with other voltages.

Turning now to the middle trace B, the signal present on the common wire 140 consists of the supply voltage to the magnetic field sensor 120, indicated at 310, and the output signal from the magnetic field sensor 120, indicated at 320, which is superimposed on the supply voltage.

The AC-coupled output signal 260 shown in trace C is not to the same scale as traces A and B for ease of visibility. As described above, in embodiments where the signal conditioning circuit 170 includes the voltage clamping circuit 250, the AC-coupled output signal 260 is clamped to ground and the controller supply voltage $V_{dd}$. The controller supply voltage $V_{dd}$ is typically 1.8V, 2.5V, 3.3V, or 5V according to the controller being used, as compared to $V_{battery}$ which is 12V in the example of FIG. 3.

In some embodiments, the controller 110 is configured to operate in an active mode and an inactive mode such as a low-power or idle mode. The controller 110 may be configured to operate in the active mode or inactive mode in response to a control signal, for instance from a vehicle control system. In such embodiments, the controller 110 is configured when in the active mode, to store a state of the magnetic field sensor 120 sensed at the controller input 105*a*. That is, the controller 110 stores the value present at the controller input 105*a*. As will be understood from the foregoing description, the value present at the controller input 105*a* is that of the AC-coupled output signal 260. The controller 110 is further configured when transitioning from the inactive mode to the active mode, in other words when entering the active mode from the inactive mode, to initialize the controller input 105*a* at a high state or low state according to the stored state of the magnetic field sensor 120.

Advantageously, initializing the controller input 105*a* to the stored state of the magnetic field sensor 120 when entering the active mode from the inactive mode prevents missed counts of pulses, thereby improving accuracy of the determined motor position. For example, the output signal 320 from the magnetic field sensor 120 shown in FIG. 3 is a square wave, with one cycle of the square wave representing a 360 degree revolution of the motor 130. The position, or number of revolutions, of the motor 130 can be determined by the controller 110 by counting the number of pulses in the output signal 320. This is typically done by counting either the number of low-to-high transitions, or high-to-low transitions, or both transitions. If the number of high-to-low transitions is being counted, the controller 110 may enter the inactive state when the output signal 320 is high, such as at point D in FIG. 3. When the controller 110 enters the active state again and resumes counting, the signal at the input 105a may no longer be in a high state, for instance if the charge has dissipated while the controller was inactive. In such circumstance, the next high-to-low transition would be missed by the controller 110. A similar situation can occur in the case of counting low-to-high transitions. Initializing the controller input 105a to the stored state of the magnetic field sensor 120 when entering the active mode from the inactive mode prevents such edge detections from being missed, improving the accuracy of the system.

In some embodiments, the controller 110 is further configured, when entering the inactive mode from the active mode, to terminate or set the controller input 105a in a high state or low state according to the stored state.

While the foregoing description has been made with reference to a single motor 130 and a single magnetic field sensor 120 for simplicity, it will be appreciated that in some embodiments there are a plurality of magnetic field sensors 120 each configured to sense the position of a respective motor 130, and a plurality of signal conditioning circuits 170. In such embodiments, each of the signal conditioning circuits 170 is configured to produce an AC-coupled output signal 260 from the output signal of a corresponding magnetic field sensor 120.

In some embodiments, the controller 110 is electrically connected to a plurality of magnetic field sensors 120, each via a respective controller input 105a. In such embodiments, the controller 110 is configured when in the active mode, to store a state of each magnetic field sensor 120 sensed at a respective controller input 105a. In such embodiments, the controller 110 is configured when entering the active mode from the inactive mode, to initialize each respective controller input 105a at a high state or low state according to the stored state of the respective magnetic field sensor 120.

Referring now to FIG. 4, there is shown a method 300 according to embodiments of the present disclosure. At 310, the comprises configuring a magnetic field sensor 120 to sense the position of a motor 130 and provide an output signal.

At 320, the method 300 further comprises conditioning the output signal to produce an AC-coupled output signal.

In some embodiments, at 330 the method 300 further comprises storing, in a controller 110, a current state of the magnetic field sensor 120. In such embodiment, the method 300 continues at 340 by initializing, when the controller 110 enters the active mode from the inactive mode, the input 105a of the controller 110 at a high state or low state according to the stored state of the magnetic field sensor 120.

At 350, the method 300 continues by processing, by controller 110, the AC-coupled output signal 260 to determine a position of the motor 130. In some embodiments, the processing comprises counting a number of pulses in the AC-coupled output signal 260.

Some embodiments of the present disclosure include a vehicle integrating any of the above-described system or methods. The vehicle may comprise a vehicle control system configured to provide a control signal to the controller 110 to configure the controller 110 to operate in the active mode or the inactive mode. The system may be configured in the vehicle to sense the position of motors performing operations such as moving wing mirrors, adjusting seat positions and lumbar support, and so on.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The term "set" generally means a grouping of one or more elements. The elements of a set do not necessarily need to have any characteristics in common or otherwise belong together. The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The invention claimed is:

1. A system comprising:
a controller;
a magnetic field sensor configured to sense a position of a motor and provide an output signal; and
a signal conditioning circuit including a high-pass filter, wherein:
the signal conditioning circuit is configured to produce an AC-coupled output signal from the output signal,
the AC-coupled output signal is an input to the controller,
the signal conditioning circuit includes a first diode configured to limit voltages in the AC-coupled output signal to a lower limit, and a second diode configured to limit voltages in AC-coupled output signal to an upper limit, and
the controller is configured to process the AC-coupled output signal by counting a number of pulses in the AC-coupled output signal to determine a position of the motor.

2. The system of claim 1 wherein the first diode and the second diode are integral to the controller.

3. The system of claim 1 further comprising:
a plurality of magnetic field sensors; and
a plurality of signal conditioning circuits, wherein:
each magnetic field sensor is configured to sense the position of a corresponding motor, and
each of the signal conditioning circuits is configured to produce an AC-coupled output signal from the output signal of a corresponding magnetic field sensor.

4. The system of claim 1 wherein the controller is configured to:
operate in an active mode or an inactive mode;
in response to being in the active mode, store a current state of each magnetic field sensor sensed at a respective controller input; and
in response to entering the active mode from the inactive mode, initialize each respective controller input to the stored state of the respective magnetic field sensor.

5. The system of claim 4 wherein the controller is further configured to, in response to entering the inactive mode from the active mode, set each controller input in a logic high state or logic low state according to the current stored state of the respective magnetic field sensor.

6. The system of claim 1 wherein each magnetic field sensor includes a hall effect sensor.

7. The system of claim 1 wherein each motor is a DC motor.

8. The system of claim 1 wherein each magnetic field sensor and corresponding motor includes an actuator.

9. A vehicle comprising:

a motor;

a controller;

a magnetic field sensor configured to sense a position of the motor and provide an output signal; and a signal conditioning circuit including a high-pass filter, wherein:

the signal conditioning circuit is configured to produce an AC-coupled output signal from the output signal, the AC-coupled output signal is an input to the controller, the signal conditioning circuit includes a first diode configured to limit voltages in the AC-coupled output signal to a lower limit, and a second diode configured to limit voltages in AC-coupled output signal to an upper limit, and the controller is configured to process the AC-coupled output signal by counting a number of pulses in the AC-coupled output signal to determine a position of the motor.

8

10. A method comprising:

configuring a magnetic field sensor to sense a position of a motor and provide an output signal;

conditioning the output signal by a signal conditioning circuit including a high-pass filter, wherein the signal conditioning circuit is configured to produce an AC-coupled output signal, and wherein the AC-coupled output signal is input to a controller; and processing, by the controller, the AC-coupled output signal by counting a number of pulses in the AC-coupled output signal to determine a position of the motor, wherein the signal conditioning circuit includes a first diode configured to limit voltages in the AC-coupled output signal to a lower limit, and a second diode configured to limit voltages in AC-coupled output signal to an upper limit.

11. The method of claim 10, wherein the processing includes:

storing, in a controller, a current state of the magnetic field sensor; and in response to the controller entering an active mode from an inactive mode, initializing an input of the controller that receives the AC-coupled output signal at a logic high state or logic low state according to the stored state of the magnetic field sensor.

\* \* \* \* \*